United States Patent [19]

Swart

[11] Patent Number: 5,233,290
[45] Date of Patent: Aug. 3, 1993

[54] SWITCH PROBE
[75] Inventor: Mark A. Swart, Upland, Calif.
[73] Assignee: Everett Charles Technologies, Inc., Pomona, Calif.
[21] Appl. No.: 787,936
[22] Filed: Nov. 5, 1991
[51] Int. Cl.$^5$ .............................................. G01R 1/06
[52] U.S. Cl. ............................... 324/72.5; 324/158 P; 200/61.76; 439/482
[58] Field of Search ............... 324/158 F, 158 P, 72.5; 439/482, 824; 200/61.76, 61.79

[56] References Cited

U.S. PATENT DOCUMENTS

| | | | |
|---|---|---|---|
| 4,658,212 | 4/1987 | Ozawa et al. | 324/72.5 |
| 4,659,987 | 4/1987 | Coe et al. | 324/72.5 |
| 4,983,909 | 1/1991 | Swart et al. | 324/72.5 |

Primary Examiner—Vinh Nguyen
Attorney, Agent, or Firm—Christie, Parker & Hale

[57] ABSTRACT

A switch probe includes an electrically conductive tubular outer receptacle and a tubular barrel in the receptacle. The barrel has a conductive inside surface and an insulative coating on its outside surface in contact with the inside of the receptacle to isolate the barrel from the receptacle. A terminal disposed in the receptacle has a conductive bearing affixed to the conductive inside of the barrel and a conductive terminal pin extending through the receptacle. An insulative coating on the surface of the terminal contacting the inside of the receptacle electrically isolates the terminal from the receptacle. A conductive plunger travels axially in the barrel against a biasing spring which retains the plunger in a normally open position. A stop in the wall of the barrel engages the plunger to retain it at a critical distance travel spaced from the receptacle. Two parallel electrically conductive paths, electrically isolated from each other, are formed axially. One conductive path extends along the plunger, the electrically conductive inside of the barrel, a conductive portion of the terminal, and to the exterior terminal pin. the other conductive path extends along the receptacle so that travel of the plunger against the bias of the spring, from the normally open position through its closure travel distance, causes the plunger to contact the receptacle and conduct along the inside diameter of the receptacle and complete a circuit through the other conductive path.

17 Claims, 6 Drawing Sheets

SWITCH PROBE

FIELD OF THE INVENTION

This invention relates to electrical contact test probes, and more particularly, to spring loaded test probes for use in the electrical testing of a variety of electrical devices. These probes are generally used to produce electrical contact between an electrical device under test and electrical diagnostic or testing equipment.

BACKGROUND OF THE INVENTION

In the automatic testing of electrical circuits, test probes of various configurations are used depending upon the type of electrical device under test. A type of test probe commonly referred to as a "switch probe" is used in the automatic electrical continuity testing of electrical equipment. Cable harnesses for automobiles are one example. Such a switch probe is used in a two-level test. The first level is a "push-out" test for testing the mechanical integrity of mounting a conductor terminal inside a plastic connector housing. If the terminal is mounted correctly, the switch closes. If the terminal is not seated correctly in the connector body, the terminal is pushed out of the connector housing and the switch does not close. The second level is an electrical continuity test.

A typical switch probe is a miniature-sized device which includes a barrel, an insulator, a terminal in one end of the barrel isolated by the insulator, a movable plunger projecting from the opposite from the end of the barrel, and a coil spring inside the barrel between the plunger and the terminal. All components are contained within an outer receptacle. A downward force applied to the plunger against the bias of the spring moves the plunger toward a switch contact point on the terminal inside the probe.

It is a difficult problem to manufacture the miniature-sized components of such switch probes while also maintaining the necessary reliable operation from cycle-to-cycle over an extremely large number of operating cycles. For instance, plunger travel inside the switch probe is particularly critical, and if the probe has a slight amount of over-travel or under-travel, the reliability of the switching process suffers. In one prior art switch probe, the critical closure travel distance is controlled by a plastic insulator that spaces the conductive elements of the switch from each other and holds active components of the switch together. The plastic insulator is a joint which holds two metal parts of the terminal barrel assembly together. Plastic does not always hold well under axial pressure because of its cold flow tendencies. In the switch assembly process, a "roll close" is used for closing the assembled parts. This produces a crimping action which can cause the plastic to cold flow. Any plastic flow can change the critical distance of switch closure travel. Switch probes with a plastic insulator also are limited in their use in thermal environments.

In these prior art switch probes, it is difficult to control tolerances so that the critical closure travel is not adversely affected. For instance, in one type of switch probe, the critical switch travel from the normally open to the closed position of the switch is about 0.025 inch. As components of the switch are assembled together, tolerances build up. Tolerances on the closure travel distance from such build-up of tolerances from the various assembled parts can be in the neighborhood of about 0.012 to about 0.015 inch. With such a wide variation in tolerances as a percentage of the specified switch closure travel, the reliability of the switch probe during use is a major problem.

The present invention provides a switch probe which greatly reduces the tolerance problems and problems of reliability associated with the prior art switch probes described above. The switch probe is also greatly simplified with fewer and less complicated parts and therefore has better control over tolerances that affect the critical switch closure distance. Plastic cold flow is avoided and use in thermal environments is not restricted.

SUMMARY OF THE INVENTION

Briefly, one embodiment of this invention comprises a switch probe having an electrically conductive tubular outer receptacle and a tubular barrel disposed in the receptacle. The barrel has an electrically conductive inside surface and an electrically insulative coating on its outer surface in contact with the inside of the receptacle, to electrically isolate the barrel from the receptacle. A terminal rigidly disposed in an end portion of the receptacle has an electrically conductive bearing affixed to the conductive inside of the barrel and a conductive terminal pin extending from the bearing, through the receptacle and projecting to the outside of the receptacle. An electrically insulative coating on a surface of the terminal contacts the inside of the receptacle to electrically isolate the terminal from the receptacle. An elongated electrically conductive plunger travels axially in the barrel against a biasing spring which retains the plunger in a normally open position, spaced from the receptacle. A stop in the wall of the barrel engages the plunger to retain it at a critical distance of switch closure travel from the receptacle. Two parallel electrically conductive paths, normally electrically isolated from each other, are formed axially along the switch. One conductive path extends along the plunger and the conductive inside surface of the barrel, to the terminal bearing and to an electrically conductive portion of the terminal pin at the exterior of the switch. A second electrical path extends along the conductive receptacle and along the plunger when the plunger moves over a critical distance of closure travel into contact with the receptacle, for closing the switch. The switch, when closed, completes a circuit from one conductive path to the other.

In this embodiment of the invention, there are no plastic parts used internally for controlling critical switch closure travel distances. Instead, the distance of switch travel is controlled critically by metal components of the switch which, in the manufacturing process, can be formed with much higher precision as to their accuracy of controlling tolerances. Mechanical parts can be soldered together for more reliable connections and the switch assembly can withstand the associated high temperatures. In addition, fewer mechanical parts are used in the switch when compared with the prior art switch probe described above. This provides more reliable control over tolerances as well as reducing manufacturing time and costs.

These and other aspects of the invention will be more fully understood by referring to the following detailed description and the accompanying drawings.

DETAILED DESCRIPTION

Prior Art Switch Probe

Figure 1:
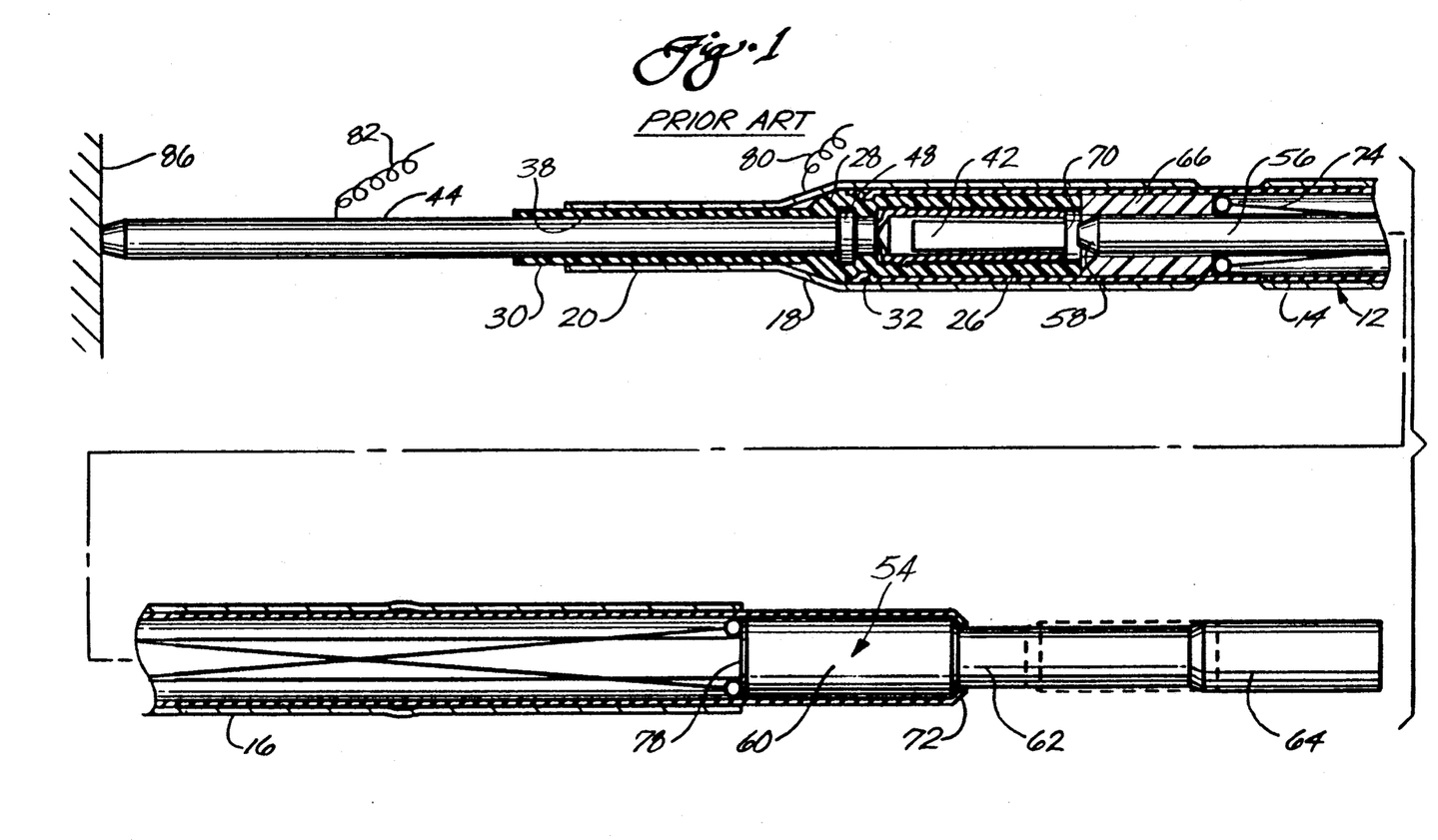
FIG. 1 is a cross-sectional view illustrating an assembled form of a prior art switch probe.
Figure 2:
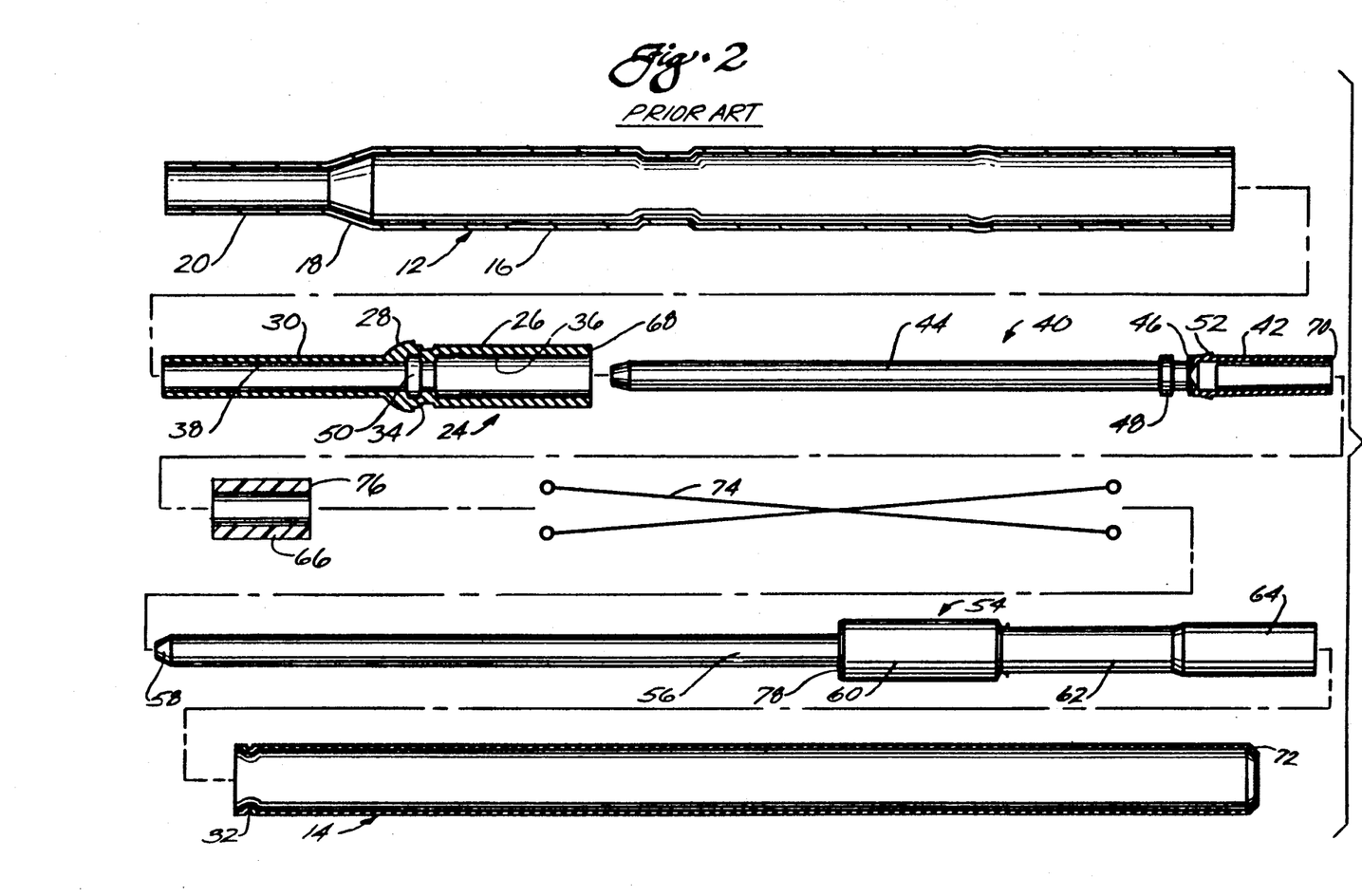
FIG. 2 is a cross-sectional view illustrating separate components of the prior art switch probe disassembled from the switch probe of FIG. 1 and arranged side-by-side for clarity.

FIGS. 1 and 2 illustrate a prior art switch probe 10 which better illustrates the improvements provided by the switch probe of this invention. FIG. 1 is a cross-sectional view illustrating the assembled form of the prior art switch probe. FIG. 2 illustrates separate components of the prior art switch probe arranged side-by-side and also shown axially in their relative positions, for clarity, to better depict the components of the prior art switch probe.

The prior art switch probe 10 includes an elongated tubular outer receptacle 12 and an elongated tubular barrel 14 affixed inside the receptacle. The barrel and receptacle are both made of metal and are therefore electrically conductive. The receptacle has a long straight main section 16 of uniform diameter with converging sides at a tapered region 18 and a short tubular end portion 20 of narrow uniform diameter. As shown best in FIG. 1, the barrel is disposed in the receptacle so that one end of the barrel is located adjacent to the tapered section 18 of the receptacle. The opposite end of the barrel projects out from the end of the receptacle.

A tubular plastic insulator 24 is located in a terminal portion of the receptacle. The insulator includes a wider diameter tubular section 26 at one end retained inside an end region of the barrel, an intermediate section 28 of complex configuration retained inside the tapered portion 18 of the receptacle, and a long narrow diameter tubular end section 30 retained inside the narrow diameter end portion 20 of the receptacle. The barrel has an annular roll close shoulder 32 which engages the plastic to cold flow and form an annular groove 34 that seats in the roll close near the intermediate region of the sleeve. This roll close rigidly secures the plastic insulator inside the end portion of the barrel adjacent the terminal end portion of the receptacle. Internally, the plastic insulator sleeve has a wider diameter passage 36 located inside the end portion of the barrel and a narrow diameter passage 38 located inside the terminal end portion of the receptacle. The passages 36 and 38 in the plastic insulator sleeve are therefore electrically insulated from the electrically conductive barrel and the conductive terminal end of the receptacle.

An elongated terminal member 40 is retained inside the barrel and projects through the receptacle to the exterior of the switch probe. The internal end of the terminal has a conductive sleeve 42 retained inside the passageway 36 in the plastic insulator sleeve 26. An electrically conductive elongated terminal pin 44 projects outwardly from the receptacle. The terminal member has an intermediate region 46 of complex configuration which includes an annular shoulder 48 rigidly retained inside an elongated annular groove 50 in the plastic insulator 24. An enlarged end portion 52 of the electrically conductive terminal is seated in the end of the passage 36 through the plastic insulator. The long, narrow terminal pin 44 of the terminal member is retained in a fixed position in the passage 38 through the insulator 24. When the insulator sleeve 26 is positioned inside the barrel and receptacle, the end region 30 of the plastic sleeve electrically isolates the terminal pin 44 from the receptacle, and the electrically conductive sleeve portion 42 of the terminal is retained inside the barrel electrically insulated from the barrel and the outer receptacle.

The prior art switch probe further includes an elongated electrically conductive plunger 54 which includes a long narrow main section 56 with a contact tip 58 and an enlarged bearing 60 at an opposite end of the main section 56. The plunger is stepped down in diameter to a narrow diameter intermediate region 62 between the bearing 60 an elongated external end region 64. The plunger is inserted into the interior of the barrel, and the end portion of the narrow main section 56 of the plunger is slidably disposed inside a plastic insulator sleeve 66 which is retained inside the barrel by the roll close crimp 32 from the receptacle. The plastic insulator sleeve 66 also bears against an annular end face 68 of the plastic insulator sleeve 24. This retains the plastic spacer 66 at a critical distance of switch closure travel spaced from a contact end face 70 of the terminal. The main portion 56 of the plunger extends through the barrel. The bearing 60 of the plunger is retained in an end portion of the barrel by a roll close 72 at the end of the barrel. The narrower diameter intermediate portion 62 of the plunger and the end 64 of the plunger both project outwardly from the switch probe, through the closed end 72 of the barrel.

An elongated coil spring shown schematically at 74 is disposed inside the barrel for normally applying a spring force to the plunger 54 to retain the plunger in its normally open position shown in FIG. 1. One end of the coil spring seats against an end face 76 of the plastic spacer 66. The opposite end of the coil spring seats against an annular shoulder 78 on the bearing portion 60 of the plunger.

When the plunger is moved into the barrel during the switching process, the plunger travels inwardly against the bias of the spring 74 so that the contact tip end 58 of the plunger moves over a critical switching distance to make contact with the annular contact end face 70 of the terminal. The prior art switch probe is wired as shown in FIG. 1, with one electrical conductor 80 contacting the outer receptacle and another electrical conductor 82 wired to the fixed terminal pin portion 44. The plunger normally makes contact with an electrical device 86 under test. When the switch is closed, an electrical path is completed between the conductors 80 and 82. If the electrical device 86 under test is functional, the closed switch probe will produce an electrical signal in the external electrical test circuitry;

whereas any defect in the device under test will not produce the necessary test signal.

In the prior art switch probe, control of switching reliability and tolerances of the components affecting the switch closure travel distance is a constant problem. These switch probes require plunger travel over a critical switching distance specified by the customer. There are certain plus or minus tolerances on the switching travel that are permissible to produce reliable operation of the switch probe. However, the switch probe is subjected to constant repetitive cycling during testing, and the closure travel distance can change during use. For instance, in the prior art switch probe the plastic insulator which holds the barrel and receptacle together can be subject to plastic cold flow during repetitive axial cycling pressures and can change the critical switching distance during use. In addition, the prior art switch probe is subject to tolerance build-up affecting the critical switch closure travel distance. The terminal is initially positioned in the plastic insulator during assembly, and this produces a first tolerance. The insulator and terminal are then seated in the barrel, producing a second tolerance. The roll close at the opposite end of the barrel produces a third tolerance. This tolerance build-up coupled with the use of plastic parts prone to cold flow problems can adversely affect control over the closure travel distance of the switch.

THE PRESENT INVENTION

Figure 3:
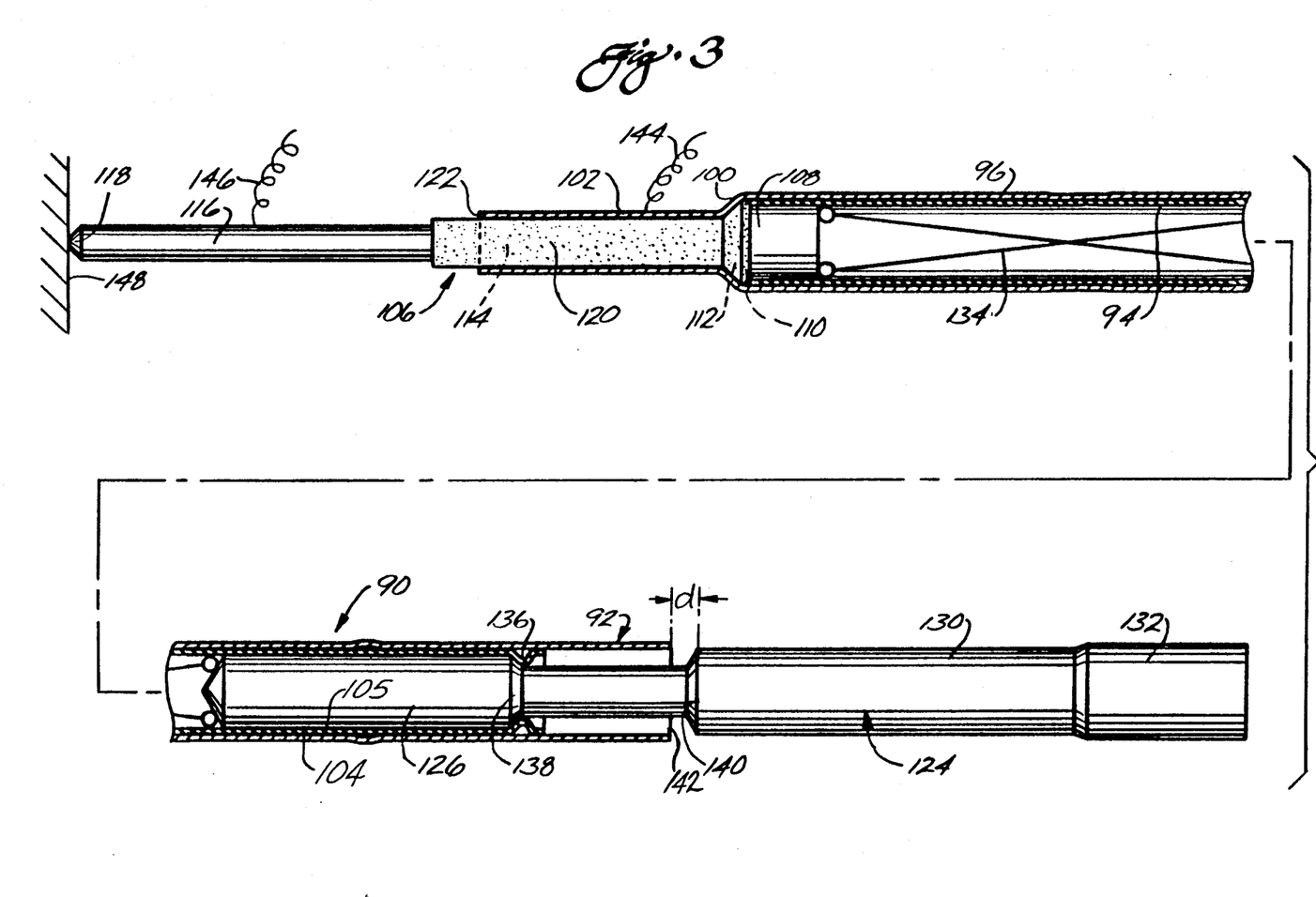
FIG. 3 is a cross-sectional view illustrating the assembled form of a switch probe according to principles of this invention.
Figure 4:
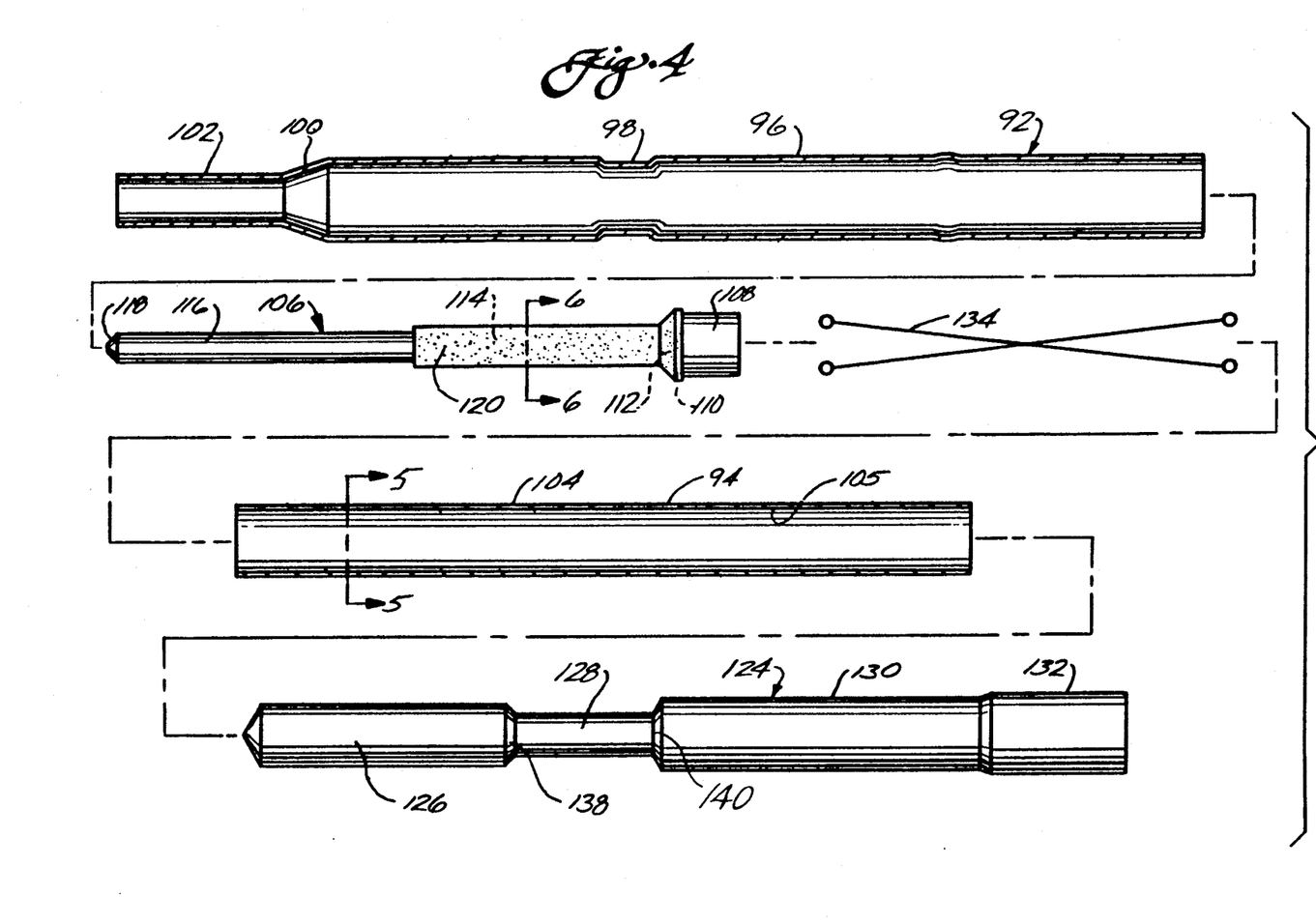
FIG. 4 is a cross-sectional view of the components of the switch probe of FIG. 3 disassembled to show the individual components arranged side-by-side in their relative positions for clarity.
Figure 5:
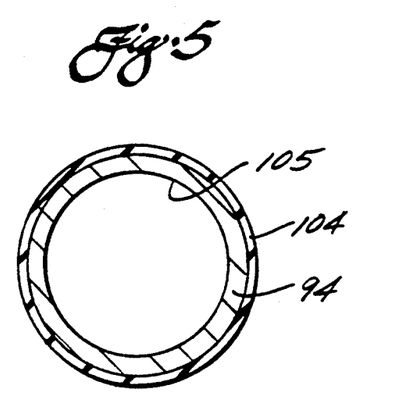
FIG. 5 is a cross-sectional view taken on line 5-5 of FIG. 4.
Figure 6:
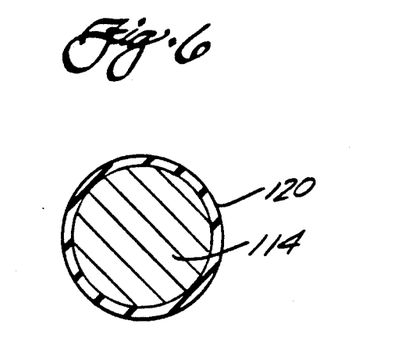
FIG. 6 cross-sectional view taken on line 6-6 of FIG. 4.

The switch probe 90 shown in FIGS. 3 through 5 overcomes these problems. The switch probe 90 of this invention contains no internal plastic parts such as sleeves or spacers that control the switch closure travel during use. FIG. 3 illustrates one embodiment of the switch probe 90 in which the switch is shown in its assembled condition in a normally open switch position. FIG. 4 illustrates the principal components of the switch shown in FIG. 3 in which the components are separated from the switch and arranged side-be-side for clarity. This figure, in a manner similar to FIG. 2, also shows the various components arranged in their relative axial positions.

The switch probe 90 includes an elongated electrically conductive tubular outer receptacle 92 and an elongated tubular barrel 94 affixed inside the outer receptacle. The receptacle has a long main portion 96 of generally uniform diameter with a roll close 98 that holds the barrel inside the receptacle. The receptacle also has a tapered section 100 with converging side walls that open into a short narrow end section 102 of uniform diameter at the end of the receptacle. The barrel outer wall contacts the inner wall of the receptacle, and the roll close 98 (shown in exaggerated form) retains the barrel in a fixed position inside the receptacle with the two surfaces predominantly in contact. An electrically insulative coating 104, shown schematically in FIG.. 4, covers the entire outer surface of the barrel from one end of the barrel to the other. Thus, as the barrel is affixed inside the outer receptacle, the electrically conductive coating electrically isolates the conductive inside surface 105 of the barrel from the electrically conductive wall of the receptacle. During use of the switch assembly, there is no wear on .the insulative coating 104 on the outside of the barrel 94. The barrel is shorter than the main tubular section 96 of the receptacle, and one end of the barrel terminates adjacent the wider end of the tapered end region 100 of the receptacle. The opposite end of the barrel is spaced inwardly from the opposite end of the receptacle.

A conductive terminal member 106 is rigidly affixed inside the tapered end portion of the receptacle. The terminal member includes a cylindrical bearing 108 affixed inside the end portion of the tubular barrel. The bearing is electrically conductive and contacts the electrically conductive inside surface 105 of the barrel. The terminal member is stepped up in diameter and includes a short uniform diameter section 110 adjacent the bearing which then is stepped down in diameter to form a tapered section 112 which then leads to an elongated cylindrical narrow diameter section 114 of uniform diameter, followed by a further stepped down narrow diameter elongated tip 116 of the terminal having a contact tip 118 spaced outside the receptacle and barrel. The outer surfaces of the short outer section 110, the tapered section 112 and the narrower intermediate section 114 of the terminal member are each covered in their entirety by an electrically insulative coating 120. When the terminal member 106 is positioned inside the switch probe as shown in FIG. 3, the outer wall section 110 contacts the conductive surface 105 inside the main section 94 of the barrel adjacent its tapered end. The tapered portion of the terminal 112 contacts the electrically conductive tapered inside wall portion 100 of the receptacle, and the electrically insulated outer surface of the intermediate portion 114 of the terminal contacts the electrically conductive inside surface of the narrow end portion 102 of the receptacle. Thus, the regions 110, 112 and 114 of the terminal are electrically isolated from the outer receptacle. The intermediate section 114 of the terminal also projects beyond the extreme outer end 122 of the outer receptacle. The terminal member itself is otherwise made from an electrically conductive material, and thus the insulative coating 120 provides the means for electrically isolating all coated portions of the terminal member from the receptacle.

The switch probe 90 also includes an elongated electrically conductive plunger 124 having an elongated, cylindrical slide member 126 of uniform diameter that slides axially inside the barrel. The plunger is stepped down to a narrow diameter section 128 adjacent the slide member and then stepped up to an elongated cylindrical wider diameter intermediate section 130 which projects to the outside of the switch probe, along with a shorter wider diameter end portion 132. The plunger 124 slides inside the barrel under the control of a coil spring shown schematically at 134. One end of the coil spring is seated against the end face of the bearing 108 of the terminal member 106. The opposite end of the spring engages the internal face of the slide member 126 of the plunger 124. A roll close 136 is formed in an end portion of the barrel adjacent the open end of the switch to control the length of switch closure travel. The roll close projects into the interior of the barrel and engages a tapered end surface 138 on the slide member 126 of the plunger. The coil spring 134 biases the plunger to its normally open position with the end face 138 in contact with the roll close 136. In the normally open position of the switch probe shown in FIG. 3, a tapered end face 140 of the plunger at the opposite end of the narrow diameter section 128 is spaced a short critical switch distance of switch travel from the annular end of the electrically conductive receptacle 142. During use, an axial force applied to the plunger 124 against the bias of the spring 134 causes the plunger to travel axially in the barrel 94 and the contact face 140 of the plunger to travel a critical distance of switch closure travel ("d" in FIG. 3) and contact the annular end 142 of the receptacle 92 for closing the switch. The end faces 140 and 142 of the plunger and receptacle therefore form axially spaced-apart contact portions of the plunger and receptacle in the normally open position of the switch. The contact portion of the plunger travels axially over the critical switch distance, from the normally open position, shown in FIG. 3 and against the bias of the spring, to make contact with the contact portion at the end of the receptacle to thereby close the switch. The plunger is designed so that in use it has an amount of overtravel into the interior of the receptacle. In one embodiment, the critical switch travel distance (to the point of contact between the contact faces 140 and 142) is 0.025 inch; whereas continued overtravel into the receptacle is 0.105 inch.

There are two parallel electrically conductive paths through the switch probe 90. A first electrically conductive path extends through the center of the probe, from the electrically conductive plunger 124, its outside portions 130 and 132 and its inside slide member 126, to the electrically conductive inside surface 105 of the barrel 94, to the electrically conductive bearing 108 of the terminal member 106, along the remainder of the electrically conductive terminal, and to its tip 116 outside the opposite end of the switch. A second electrically conductive path extends along the body of the outer receptacle 96, from its contact end 142 to the opposite end 122 of the receptacle. The electrically insulative coating 120 electrically isolates the portions 110, 112 and 120 of the terminal member from the receptacle. The bearing 108 of the terminal member is disposed inside the barrel, and thus, the exterior insulative coating 104 of the barrel electrically isolates the bearing 108 of the terminal from the receptacle. In the electrical test circuit to which the switch probe 90 is wired, one electrical conductor 144 is wired to the receptacle, and a second electrical contact 146 is wired to the terminal pin 116. The contact tip 118 of the terminal makes electrical contact with a device under test. When the contact portion 140 of the normally open switch probe is closed against the contact end 142 of the receptacle, an electrical circuit is completed between the plunger and the outer receptacle to cause current flow along the two electrical paths and in the circuit wired to the conductors 144 and 146 to provide a test signal through the switch probe.

In one embodiment, the electrically insulative coatings applied to the terminal member and to the outer surface of the barrel can be made from various electrically insulative materials capable of being coated on metal. In the embodiment of this invention, the electrically insulative coatings are in fixed areas of the switch probe and are, therefore, not subject to wear from the contact of sliding parts. One preferred insulator is Paralene and another is Teflon. These materials can be vapor deposited on the terminal member and barrel by a dry film lubrication technique. The coating is approximately in the range of 0.0005 inch in thickness.

The switch probe of this invention is an improvement over the prior art switch probe described above because it has less parts, better control over tolerances, and a reduced expense to assemble into its completed form. Tolerance build-up problems are greatly reduced, and with the absence of plastic parts control over the switch closure distance during use is more reliable.

Figure 7:
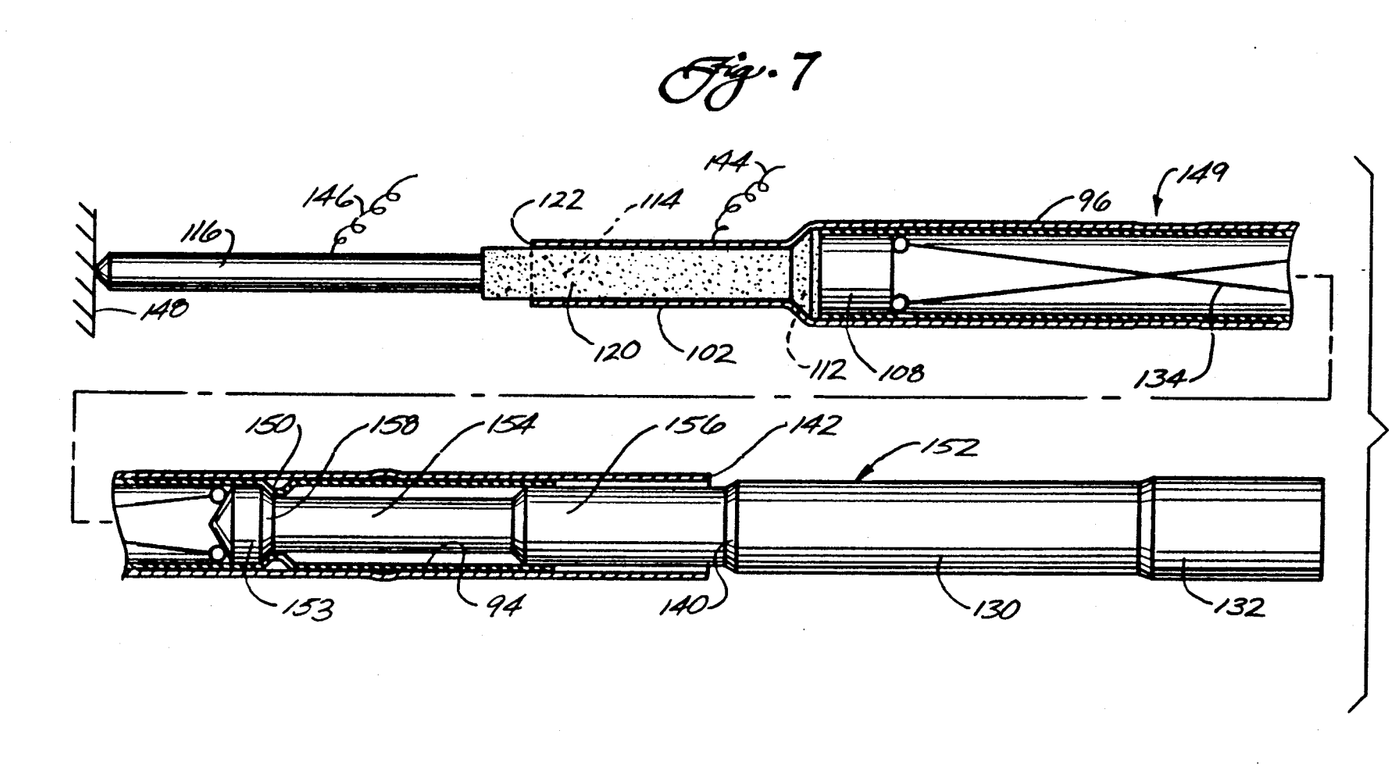
FIG. 7 is a cross-sectional view showing the assembled form of an alternative embodiment of the switch probe shown in FIG. 3.

FIG. 7 is an alternative form of the switch probe shown in FIG. 3. In the embodiment shown in FIG. 7 the roll close on the barrel is moved to a location at 150, and the configuration of the plunger 152 is changed. In this embodiment the exterior portion of the plunger is the same as the plunger 124 shown in FIG. 3. However, the interior configuration of the plunger is changed and includes a short, slide-bearing portion 153 in contact with the coil spring 134, a narrow diameter internal portion 154 and a larger diameter intermediate portion 156 that slides in the barrel 94. A tapered end face 158 of the plunger located at about the center of the receptacle engages the roll close 150 to control the distance of closure travel between the end face 142 of the receptacle and the contact face 140 of the plunger. Thus, in this embodiment the stop provided by the roll close 150 is located internally farther into the switch probe than the roll close stop 136 of FIG. 3 which is located closer to the end of the switch probe. All other components of the switch probe are the same as the probe shown in FIG. 3.

I claim:

1. A switch probe comprising:
   an electrically conductive tubular outer receptacle,
   a tubular barrel rigidly secured inside the receptacle so the outer receptacle and the barrel extend along a common axis, the barrel having an electrically conductive inside surface and an electrically insulative outer surface for electrically isolating the conductive inside surface of the barrel from the conductive outer receptacle, and
   a terminal comprising an elongated continuous member having separate sections thereof spaced apart along the axis of the receptacle and the barrel, the terminal sections defining a first bearing portion, a second bearing portion continuous with the first bearing portion, and a terminal pin continuous with the second bearing portion, the first bearing portion being electrically conductive and affixed to the electrically conductive inside surface of the barrel so the first bearing portion is electrically isolated from the receptacle, the second bearing portion having an electrically insulative outer surface affixed in an end portion of the receptacle for electrically isolating the second bearing portion from the receptacle, the terminal pin projecting to the exterior of the receptacle,
   an electrically conductive plunger slidably disposed in the barrel under spring pressure normally retaining the plunger in a normally open position, the barrel having a stop positioned axially so as to normally retain a contact portion of the plunger spaced by a critical switching distance from a contact portion of the conductive outer receptacle when the plunger is in said normally open position,
   the plunger being movable against said spring pressure into the receptacle to travel said critical switching distance to make contact with the electrically conductive receptacle in a closed position of the plunger.

2. A switch probe according to claim 1, in which the electrically insulative portions of the terminal and the outside surface of the barrel are formed by a electrically insulative coatings.

3. A switch probe comprising:
   an elongated, tubular electrically conductive outer receptacle;

an elongated, tubular barrel rigidly affixed inside a portion of the receptacle, the barrel having an electrically conductive inside surface and an electrically insulative outer surface for electrically isolating the conductive inside surface of the barrel from the conductive outer receptacle, an elongated terminal having an electrically conductive bearing portion rigidly affixed to the inside of the barrel and having an elongated electrically conductive exterior terminal pin continuous with the bearing and projecting outwardly from the barrel and the receptacle, an elongated electrically conductive plunger having an inside portion slidably disposed inside the barrel for spring biased travel into the barrel against spring pressure to move over a critical switching distance from a normally open position out of contact with the receptacle to a closed position in contact with the receptacle, the barrel having a stop engaging the plunger for holding the plunger in its normally open position, a first electrical path extending axially along the plunger, to the electrically conductive inside surface of the barrel, to the electrically conductive bearing portion of the terminal and to the exterior pin of the terminal, the terminal having an electrically conductive intermediate portion between the bearing and the terminal pin with an electrically insulative surface electrically isolating the first electrical path from a generally parallel second electrical path extending axially along the conductive outer receptacle, to thereby, electrically isolate the terminal pin from the receptacle, the plunger being movable against said spring pressure and from the normally open position of the switch through its critical switching distance to its closed position to cause the plunger to contact the receptacle and thereby electrically connect the first electrical path to the second electrical path.

4. A switch probe according to claim 3, in which the electrically insulative surfaces are formed by non-conductive coatings.

5. A switch probe comprising:
a tubular electrically conductive receptacle,
a tubular barrel rigidly affixed in the receptacle, the barrel having an electrically conductive inside surface and an electrically insulative outer surface electrically isolating the conductive inside surface of the barrel from the receptacle,
a rigid continuous metal terminal having an electrically conductive terminal pin extending outside the receptacle, an electrically conductive interior portion rigidly affixed inside the barrel for electrical contact with the conductive inside surface of the barrel, and an intermediate portion between the terminal pin and the interior portion of the terminal having an electrically insulative surface electrically isolating the interior portion of the terminal from the receptacle,
a movable plunger slidably disposed inside the barrel and retained by spring pressure in a normally open position spaced from the receptacle,
a first electrical path formed along the plunger, to the barrel through contact between the plunger and the conductive inside surface of the barrel, to the interior portion of the terminal and to the terminal pin, a second electrical path formed along the receptacle and to the terminal pin when the plunger moves from its normally open position spaced from the receptacle into contact with the receptacle.

6. A switch probe according to claim 5, in which the spacing between the receptacle and plunger over which the receptacle travels to close the switch is controlled by the position of a stop formed by the inside of the barrel contacting the plunger to retain the plunger spaced from the receptacle and in the normally open position of the plunger.

7. A switch probe according to claim 5, in which the inside portion of the barrel is electrically isolated from the receptacle by an electrically insulative coating on the outer surface of the barrel in contact with an electrically conductive inside surface of the receptacle.

8. A switch probe according to claim 7, in which the interior portion of the terminal is electrically isolated from the receptacle by an electrically insulative coating on the terminal in contact with the conductive inside surface of the receptacle.

9. A switch probe according to claim 5, further includes an electrically conductive biasing spring in contact between the plunger and the interior portion of the terminal.

10. A switch according to claim 9, in which the spacing between the receptacle and plunger over which the plunger travels is controlled by the position of a stop formed by the inside of the barrel contacting the plunger to retain the plunger spaced from the receptacle and in the normally open position of the plunger.

11. A switch probe according to claim 10, in which the barrel is electrically isolated from the receptacle by an electrically insulative coating on the outer surface of the barrel in contact with an electrically conductive inside surface of the receptacle.

12. A switch probe according to claim 11, in which the interior portion of the terminal is electrically isolated from the receptacle by an electrically insulative coating on the terminal in contact with the conductive inside surface of the receptacle.

13. A switch probe comprising:
a tubular electrically conductive outer receptacle,
a tubular barrel rigidly affixed inside the receptacle, the barrel having an electrically conductive inside surface and an electrically insulative outer surface for electrically isolating the inside surface of the barrel from a portion of the electrically conductive outer receptacle,
an elongated electrically conductive plunger slidably disposed in electrical contact with the conductive inside surface of the barrel, the plunger being movable into the barrel for spring biased travel against spring pressure to move over a critical switching distance from a normally open position out of contact with the receptacle to a closed position in contact with the receptacle,
an elongated rigid metal terminal having a bearing portion rigidly affixed inside the barrel and electrically communicating with a terminal pin portion of the terminal, said terminal pin extending to the exterior to the receptacle and normally electrically isolated from the receptacle in the normally open position of the plunger,
a first electrical path formed along the plunger to the barrel through contact between the plunger and the conductive inside surface of the barrel, to the bearing portion of the terminal, and to the terminal pin, a second electrical path formed along the receptacle and to the terminal pin when the plunger moves from its normally open position spaced from the receptacle into contact with the receptacle.

14. A switch probe according to claim 13 in which the spacing between the plunger and plunger over which the receptacle travels is controlled by the position of a stop formed by the inside of the barrel contacting the plunger to retain the plunger spaced from the receptacle and in the normally open position of the plunger.

15. A switch probe according to claim 13 in which the barrel is electrically isolated from the receptacle by an electrically insulative coating on the outer surface of the barrel in contact with the electrically conductive inside surface of the receptacle.

16. A switch probe according to claim 15 in which the bearing portion of the terminal is electrically isolated from the receptacle by an electrically insulative coating on a portion of the terminal connecting the bearing portion thereof with the terminal pin portion thereof and in which the electrically insulative coating on the terminal contacts the conductive inside surface of the receptacle.

17. A switch probe according to claim 13 further includes an electrically conductive biasing spring in contact between the bearing portion of the terminal and the plunger.

* * * * *

UNITED STATES PATENT AND TRADEMARK OFFICE
CERTIFICATE OF CORRECTION

PATENT NO. : 5,233,290
DATED      : August 3, 1993
INVENTOR(S) : Mark A. Swart

It is certified that error appears in the above-indentified patent and that said Letters Patent is hereby corrected as shown below:

Column 2, line 33, change "plunge" to -- plunger --.

Column 3, line 18, before "cross-sectional" insert -- is a --.

Column 5, line 53, after "inner" delete the comma.

Column 10, line 27, before "according" insert -- probe --.

Signed and Sealed this

Third Day of May, 1994

Attest:

BRUCE LEHMAN

*Attesting Officer*  *Commissioner of Patents and Trademarks*